United States Patent
Pekarik et al.

(10) Patent No.: US 7,382,029 B2
(45) Date of Patent: Jun. 3, 2008

(54) METHOD AND APPARATUS FOR IMPROVING INTEGRATED CIRCUIT DEVICE PERFORMANCE USING HYBRID CRYSTAL ORIENTATIONS

(75) Inventors: John J. Pekarik, Underhill, VT (US); Xudong Wang, Groton, MA (US)

(73) Assignee: International Business Machines Corporation, Armonk, NY (US)

( * ) Notice: Subject to any disclaimer, the term of this patent is extended or adjusted under 35 U.S.C. 154(b) by 361 days.

(21) Appl. No.: 11/161,337

(22) Filed: Jul. 29, 2005

(65) Prior Publication Data

US 2007/0026598 A1     Feb. 1, 2007

(51) Int. Cl.
   *H01L 29/76* (2006.01)
   *H01L 21/8234* (2006.01)

(52) U.S. Cl. .............. 257/392; 257/391; 257/627; 438/275; 438/152

(58) Field of Classification Search .......... 438/199, 438/200, 229, 231, 152–155, 275; 257/391, 257/392, 627, 368
See application file for complete search history.

(56) References Cited

U.S. PATENT DOCUMENTS

| | | | |
|---|---|---|---|
| 4,823,092 A | | 4/1989 | Pennock |
| 5,384,473 A | * | 1/1995 | Yoshikawa et al. ......... 257/255 |
| 5,714,906 A | * | 2/1998 | Motamed et al. .......... 327/563 |
| 6,275,079 B1 | * | 8/2001 | Park ............................ 327/143 |
| 6,657,223 B1 | | 12/2003 | Wang et al. |
| 6,794,718 B2 | | 9/2004 | Nowak et al. |
| 6,998,684 B2 | | 2/2006 | Anderson et al. ........... 257/351 |
| 2003/0030056 A1 | | 2/2003 | Callaway, Jr. |
| 2003/0034545 A1 | | 2/2003 | Johnson et al. |
| 2004/0151917 A1 | | 8/2004 | Chen et al. |
| 2004/0195623 A1 | | 10/2004 | Ge et al. |
| 2004/0195646 A1 | | 10/2004 | Yeo et al. |
| 2004/0256700 A1 | | 12/2004 | Doris et al. |
| 2005/0199984 A1 | | 9/2005 | Nowak ....................... 257/627 |

FOREIGN PATENT DOCUMENTS

JP   2004153256 A   4/2004

OTHER PUBLICATIONS

M. Shima et al., "<100>Channel Strained-SiGe p-MOSFET with Enhanced Hole Mobility and Lower Parasitic Resistance;" 2002 Symposium On VLSI Technology Digest of Technical Papers; pp. 94-95.

M. Yang et al., "High Performance CMOS Fabricated on Hybrid Substrate With Different Crystal Orientations;" IEDM 03; 2003; pp. 453-456.

* cited by examiner

*Primary Examiner*—Michael Trinh
(74) *Attorney, Agent, or Firm*—Cantor Colburn LLP; Michael LeStrange (57) ABSTRACT

A method for implementing a desired offset in device characteristics of an integrated circuit includes forming a first device of a first conductivity type on a first portion of a substrate having a first crystal lattice orientation, and forming a second device of the first conductivity type on a second portion of the substrate having a second crystal lattice orientation. The carrier mobility of the first device formed on the first crystal lattice orientation is greater than the carrier mobility of the second device formed on the second crystal lattice orientation.

4 Claims, 7 Drawing Sheets

METHOD AND APPARATUS FOR IMPROVING INTEGRATED CIRCUIT DEVICE PERFORMANCE USING HYBRID CRYSTAL ORIENTATIONS

BACKGROUND

The present invention relates generally to integrated circuit devices, and, more particularly, to a method and apparatus for improving integrated circuit device performance using hybrid crystal orientations.

Complementary metal-oxide-semiconductor (CMOS) technology is the predominant semiconductor technology used for the manufacture of ultra-large scale integrated (ULSI) circuits today. Conventional CMOS technology generally employs silicon (Si) wafers as the starting material for volume production. These silicon wafers generally have a single crystal surface that is (100) oriented; i.e., the normal to the silicon wafer surface is in the [100] direction. Hence, conventional planar metal-oxide-semiconductor field-effect transistors (MOSFETs) formed on (100) silicon wafers have a gate dielectric-channel interface plane that is in the (100) plane of the silicon substrate.

Electrons are known to have a relatively high mobility for a (100) Si surface orientation, whereas holes are known to have high mobility for a (110) surface orientation. More specifically, hole mobility values for (100) Si are roughly two to four times lower than the corresponding electron mobility values for this crystallographic orientation. As a result, n-type devices formed in (100) silicon have a higher carrier mobility than p-type devices (with comparable device geometry) formed in (100) silicon. Thus, in order to compensate for this discrepancy, PFET devices are typically designed with larger widths with respect to NFET devices in order to balance the PFET pull-up currents against the NFET pull-down currents and achieve uniform circuit switching.

Figure 1:
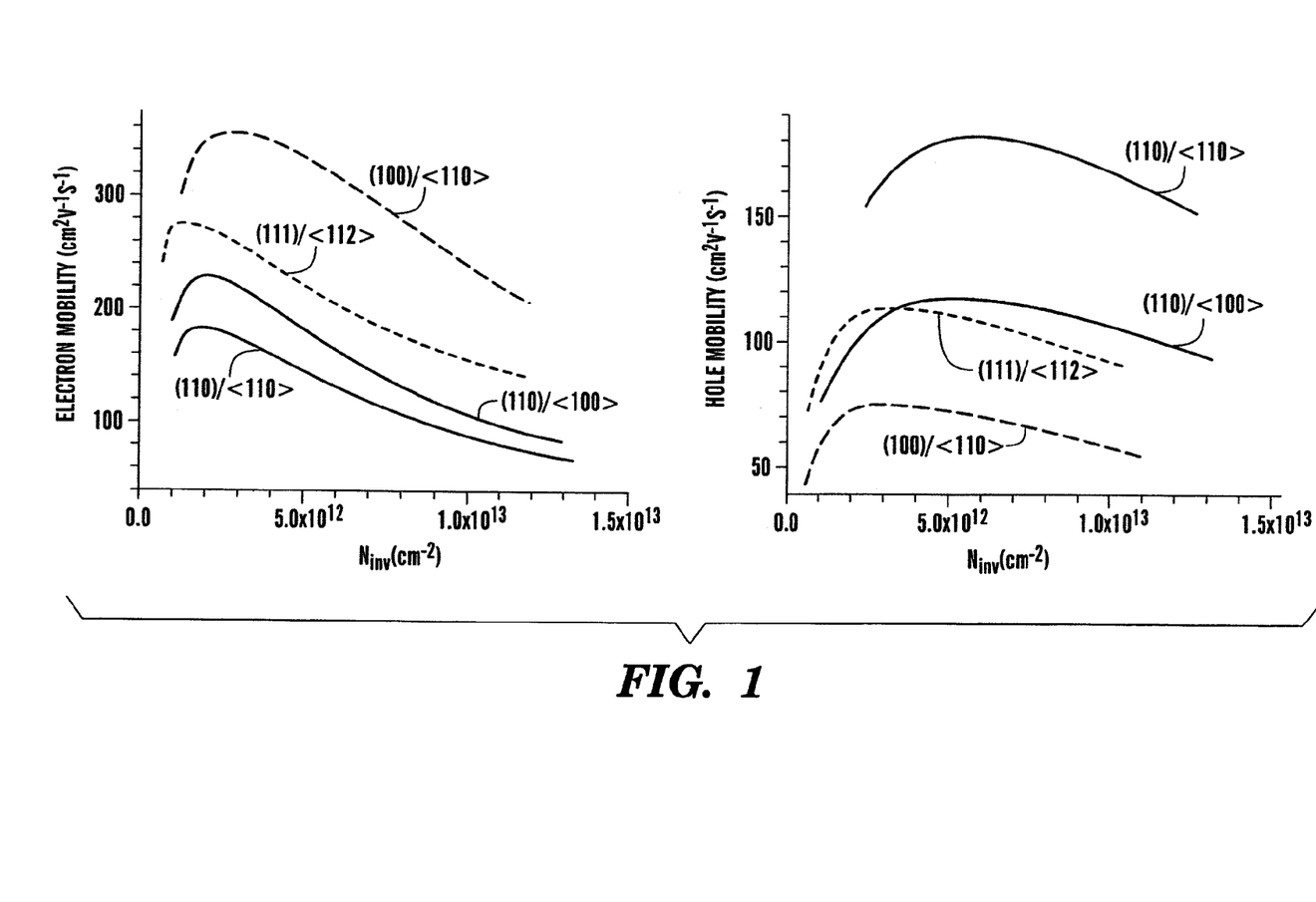
FIG. 1 is a pair of graphs illustrating a comparison of electron and hole mobilities with respect to different crystal orientations.

On the other hand, hole mobilities for (110) Si are about twice as high than for (100) Si. Consequently, PFETs formed on a (110) Si surface will exhibit significantly higher drive currents than PFETs formed on a (100) surface. Unfortunately, electron mobilities for (110) Si surfaces are significantly degraded as compared to (100) Si surfaces. A comparison of electron and hole mobilities with respect to different crystal orientations is illustrated in FIG. 1. As will be noted from a speed perspective, a (110) Si surface is optimal for PFET devices because of the excellent hole mobility, while a (100) Si surface is optimal for NFET devices because of the excellent electron mobility.

In order to fully utilize the advantage of the carrier mobility dependence on substrate orientation, various technologies of fabricating CMOS on hybrid substrates with different crystal orientations have been developed, in which the NFETs are manufactured at (100) surface orientations within the hybrid substrates, while the PFETs are manufactured at (110) surface orientations within the hybrid substrate. Because both types of devices (NFETs and PFETs) are operating with their respective carriers at peak mobilities, the resulting CMOS has overall higher speed and transconductance (or gain) as compared with a traditional CMOS structure where both the NFET and PFET are located on the same (100) substrate. In this application, the main benefit is the optimization of device performance since the PFET devices, being located on (110) substrates, now have comparable carrier mobilities as the (100) NFET devices.

In other instances, however, maximization of carrier mobility is not the desired goal of certain semiconductor devices. Thus, it is also desirable to be able to fabricate semiconductor devices having, for example, offset characteristics with respect to one another, and in a manner that conserves device real estate.

SUMMARY

The foregoing discussed drawbacks and deficiencies of the prior art are overcome or alleviated by a method for implementing a desired offset in device characteristics of an integrated circuit. In an exemplary embodiment, the method includes forming a first device of a first conductivity type on a first portion of a substrate having a first crystal lattice orientation, and forming a second device of the first conductivity type on a second portion of the substrate having a second crystal lattice orientation. The carrier mobility of the first device formed on the first crystal lattice orientation is greater than the carrier mobility of the second device formed on the second crystal lattice orientation.

In another embodiment, an apparatus method for implementing a desired offset in device characteristics of an integrated circuit includes a first device of a first conductivity type formed on a first portion of a substrate having a first crystal lattice orientation, and second device of the first conductivity type formed on a second portion of the substrate having a second crystal lattice orientation. The carrier mobility of the first device formed on the first crystal lattice orientation is greater than the carrier mobility of the second device formed on the second crystal lattice orientation.

BRIEF DESCRIPTION OF THE DRAWINGS

Referring to the exemplary drawings wherein like elements are numbered alike in the several Figures.

DETAILED DESCRIPTION

Disclosed herein is a method and apparatus for improving integrated circuit device performance using hybrid crystal orientations. For certain integrated circuit applications, there is a benefit to having NFET (or PFET) pairs manufactured on hybrid substrates having different orientations. For example, an NFET (or PFET) pair formed with the same device geometry, but on substrates of different orientations, will primarily demonstrate the same electrical performance except for performance related to carrier mobility. Advantageously, such NFET (or PFET) pairs may be used in applications such as current/voltage generators, for example, or used to generate a repeatable offset in device characteristics, rather than for maximizing speed as previously used. In previous applications where a repeatable offset is designed, the existing approaches included, for example, varying the dimensions, operating conditions and/or process characteristics of the devices. The present invention embodiments introduce a new approach in producing repeatable offsets for device pairs.

Briefly stated, the present invention embodiments provide for a pair of MOS devices of the same conductivity and geometry (e.g., an NFET pair or PFET pair), in which one of the devices is formed on a substrate of a first crystal orientation and the other device is formed on a substrate of a different crystal orientation. This pair of MOS devices may in turn be used to improve the matching performance of elements included within, for example, a current mirror, a constant-gm biasing circuit and/or any other device in which highly repeatable offset characteristics are desired.

As indicated above, various techniques have been developed for forming a single, hybrid substrate having multiple crystal orientations. For example, in U.S. Patent Application Publication 2004/0151917, incorporated herein by reference in its entirety, a hybrid silicon structure is provided by physically bonding a first substrate of a (100) crystallographic orientation with a second substrate of a (110) crystallographic orientation. Another possible approach to forming a pair of devices in different crystal orientations is to orient the two devices at 45-degree angles with respect to one another, as is described in M. Shima, et al., "<100> Channel Strained-SiGe p-MOSFET with Enhanced Hole Mobility and Lower Parasitic Resistance", IEEE 2002 Symposium on VLSI Technology Digest of Technical Papers, pp. 94-95, incorporated herein by reference in its entirety. Regardless of how the different crystal orientations are realized for each device pair, the present approach exploits the conventional wisdom of using identical device layout in order to achieve optional matching characteristics, but further utilizes the difference in carrier mobility to achieve desired controlled offsets in circuit behavior.

Referring once again to FIG. 1, it will be seen from the electron mobility curves therein that the electron mobility varies from about 100 cm$^2$/V·S on a (110) Si substrate to about 260 cm$^2$/V·S on a (100) Si substrate when the inversion charge density is about $9 \times 10^{12}$ cm$^{-2}$. If a bias voltage $V_{GS}$ is applied to a particular NFET device, then the current therethrough will be given by the expression:

$$I_D = \frac{1}{2}\mu_n C_{ox}\frac{W}{L}(V_{GS} - V_{TH})^2$$

for the biasing condition of $V_{DS} > V_{GS} - V_{TH}$. Given the same bias voltage, an NFET formed on a (100) oriented substrate will pass about 2.6 times more current than an NFET with identical geometry but formed on a (110) oriented substrate. In the present disclosure, such a pair is an example of what will be also referred to hereinafter as a Hybrid Orientation Substrate Technique (HOST) device pair. The specific properties of a HOST pair (i.e., a first device of a given conductivity formed on a substrate of a first crystalline orientation and a second device of the same conductivity formed on a substrate of a second crystalline orientation) make such a pair useful in various exemplary circuit designs presented below.

For example, a current mirror is a circuit device used to produce an output current that has a fixed relationship or ratio to a reference current. Current mirrors are one of the most popular circuit blocks used in integrated circuits. In a typical application, the fixed relationship of the generated output current is such that its value is usually either a multiple or a fraction of the value of reference current. A conventional NFET implementation of a current mirror 200 is illustrated in the schematic diagram of FIG. 2. Since both NFETs N1 and N2 are biased at the same gate voltage ($V_{gs}$), the ratio of the output current to the reference current corresponds to the ratio of the device width of N2 to the device width of N1 (i.e., $I_{out}/I_{ref} = W_{N2}/W_{N1}$), assuming that the device length of the N1 and N2 are the same. If the circuit design calls for a larger output current with respect to the reference current, then the current mirror circuit 200 is configured such that the effective device width of N2 is larger than the effective device width of N1. Conversely, if a smaller magnitude of output current is desired with respect to the reference current, then N1 will have a larger effective device width than N2. Regardless of whether $I_{out}$ is larger or smaller than $I_{ref}$, an integral multiple relationship between $I_{ref}$ and $I_{out}$ is typically used in the design.

Figure 2:
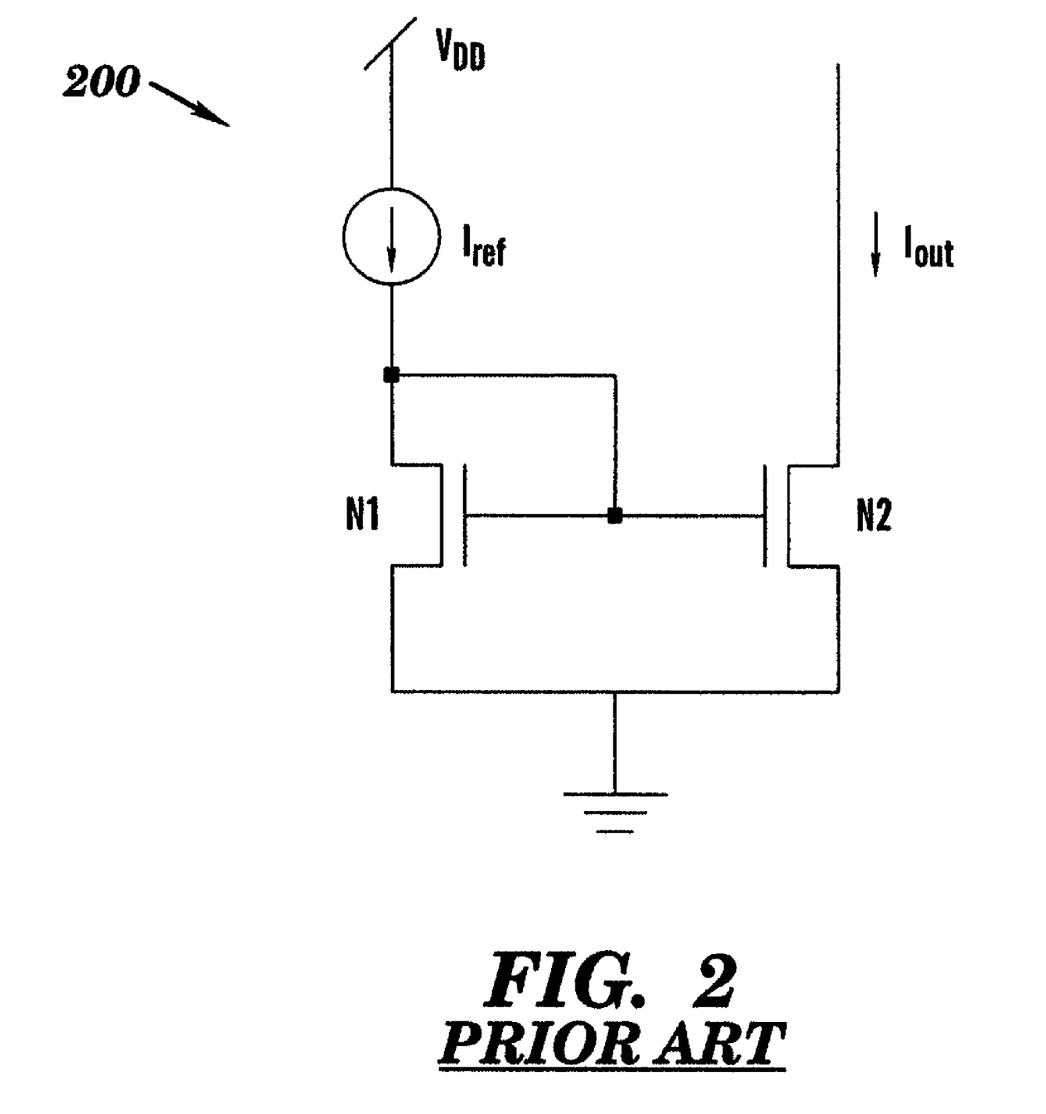
FIG. 2 is a schematic diagram of an existing NFET current mirror device.

For example, if it is desired to configure the current mirror 200 such that the value of $I_{out}$ is K times the value of $I_{ref}$ (with K being an integer), then the device depicted by N2 in FIG. 2 may actually be implemented by K individual NFETs connected in parallel with one another, with each of the K NFETs having the same geometry as NFET N1. Such a configuration is commonly configured through "multi-finger" devices, and generally works well so long as N1 and each of the individual NFETs of N2 have the same electrical performance. As a practical matter, however, a multi-finger device (such as might be embodied by N2) may demonstrate different electrical performance with respect to the single finger device (N1) as a result of different device stresses during the formation thereof.

Figure 3A:
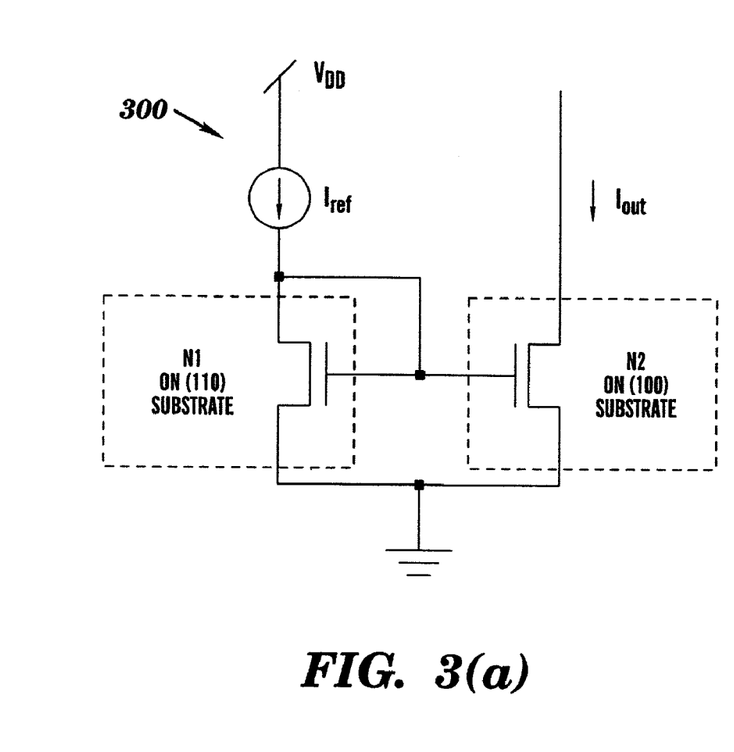
FIG. 3(a) is a schematic diagram of an NFET current mirror device in which one NFET is formed on a substrate of a first crystalline orientation, and another NFET is formed on a substrate of a second crystalline orientation, in accordance with an embodiment of the invention.

Accordingly, a HOST pair as set forth in the present disclosure provides a novel way of implementing such a current mirror, because the variation in carrier mobility due to forming like conductivity devices on differently oriented substrate provides another design variable, in addition to device number and/or device size. FIG. 3(a) is a schematic of a NFET type current mirror 300 configured in accordance with an embodiment of the invention. As is illustrated, the N1 is formed on a portion of a substrate having a (110) orientation, while N2 is formed on another portion of the substrate having a (100) orientation. Where the NFET pair is constructed with the same device geometry, the ratio of the output current to the reference current is dictated by the ratio of the carrier mobility (electron in this example) of N2 to the carrier mobility of N1; that is, $I_{out}/I_{ref} = \mu_{N2}/\mu_{N1}$.

Thus, for equal device geometries, the value of $I_{out}$ will be roughly 2.6 times that of $I_{ref}$ since N1 is formed on the (110) orientation Si substrate, which has a lower electron mobility than NFET N2 formed on the (100) orientation. It will be appreciated that where this specific current offset (due to just the difference in substrate mobilities) is a desired amount, then the need for creating the NFET pair at different geometries or adding additional devices in parallel is obviated. However, it is also contemplated that the HOST technique disclosed herein could also be combined with existing methods of establishing the ratio of $I_{out}/I_{ref}$, if other ratios are so desired.

Figure 3B:
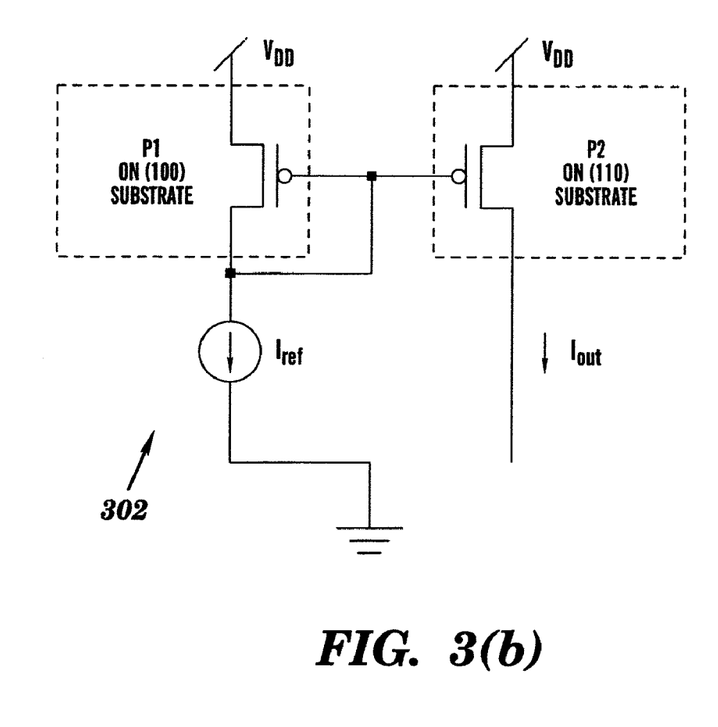
FIG. 3(b) is a schematic diagram of a PFET implementation of a current mirror device in accordance with another embodiment of the invention.

FIG. 3(b) is a PFET embodiment 302 of the current mirror shown in FIG. 3(a), demonstrating the applicability of p-type devices to the HOST technique as well. In this example, $I_{out}$ is also intended to be greater than $I_{ref}$. Thus, for this implementation, it is noted that P2 is formed on the (110) orientation substrate and P1 is formed on the (100) orientation substrate since the hole mobility is larger for the (110) orientation.

Figure 4:
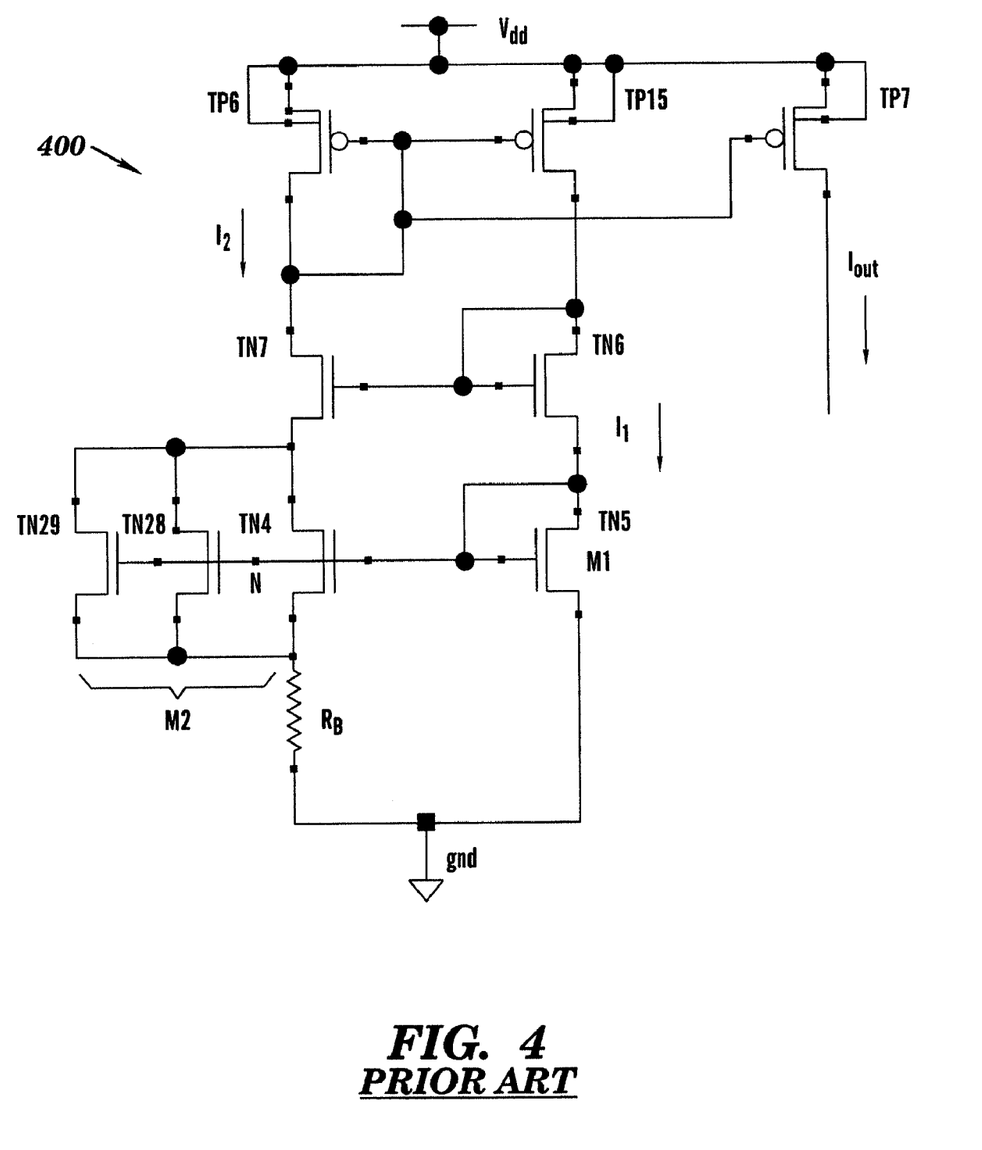
FIG. 4 is a schematic diagram of an existing constant transconductance circuit.

Another example of a practical circuit to which the HOST pairs are applicable is a constant transconductance ($g_m$) circuit employing FET technology. An example of a conventional transconductance circuit 400 is illustrated in the schematic diagram of FIG. 4. The transconductance circuit 400 includes a current mirror portion comprising PFETs TP6 and TP15 configured for equalizing the currents $I_1$, $I_2$, flowing therethrough. The gate of PFET TP7 is also coupled to the gates of TP6 and TP15 to provide a mirrored output of $I_1$ and $I_2$ at $I_{out}$. In addition, the current mirror portion provides NFETs TN6 and TN7 for adjusting the drain voltage thereof. As a result of the resistor $R_B$, the group of NFETs represented by M2 on the left side of the transconductance circuit 400 are configured to source the same amount of current as the single NFET M1 on the right side of the circuit 400. Where the M2 devices are of equal channel length with respect to the M1 device, then effective size of the M2 channel width is N times the effective channel width of M1, with N representing the number of parallel NFETs used for M2. The device characteristics are given by:

$$I2 = (V_{gs1} - V_{gs2})/R_B$$

Since $I_1 = I_2$, $$I_2 = \frac{1}{R_B^2}\left(1 - \frac{1}{\sqrt{N}}\right)^2 \frac{2}{\mu_n C_{ox}(W_2/L_2)}$$

$$g_m = \sqrt{2\mu_n C_{ox}(W/L)I_D}$$

Thus, the transconductance of the circuit will be:

$$g_m = \frac{2}{R_B}\left(1 - \frac{1}{\sqrt{N}}\right)$$

It can be seen that $g_m$ is a value independent with respect to temperature, supply voltage and MOS device parameters, which is a very desirable feature for the circuit design.

Figure 5:
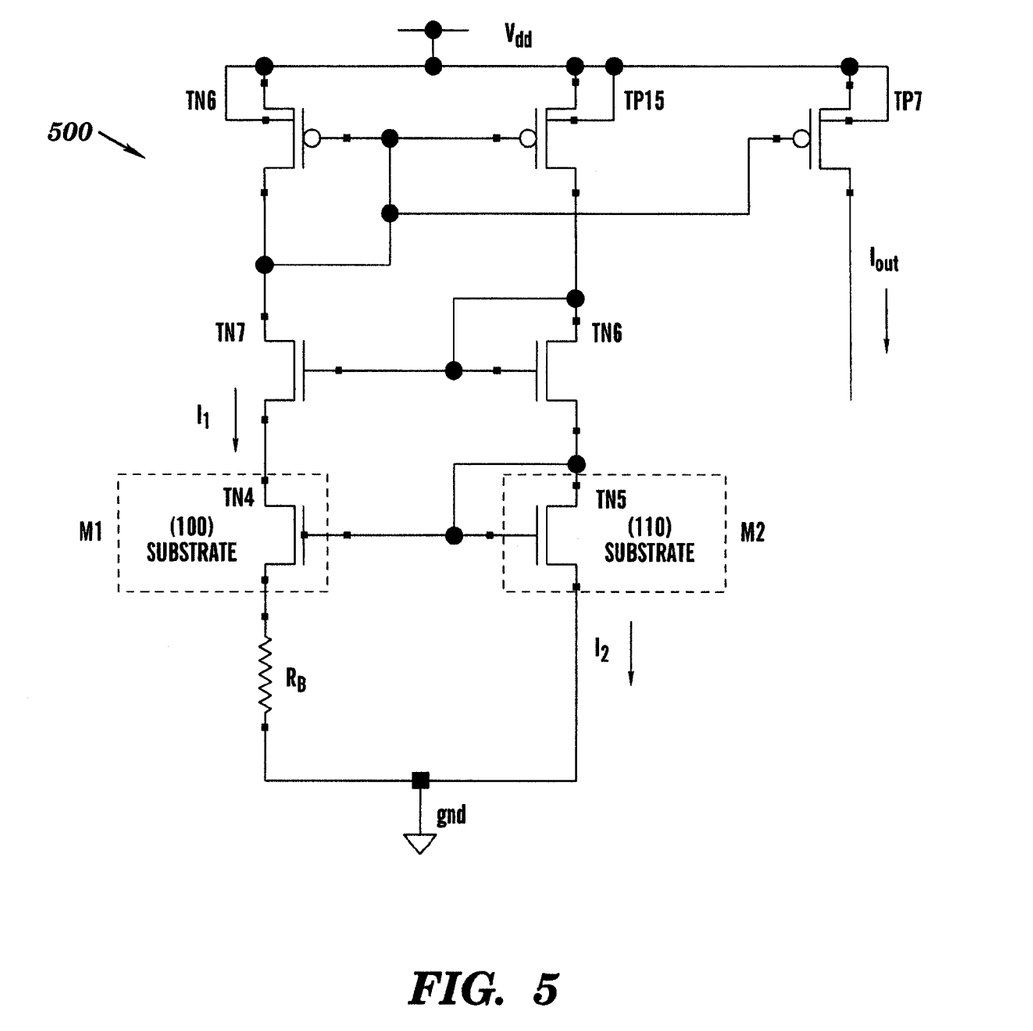
FIG. 5 is a schematic diagram of a constant transconductance circuit in which one NFET is formed on a substrate of a first crystalline orientation, and another NFET is formed on a substrate of a second crystalline orientation, in accordance with another embodiment of the invention.

As is the case with a current mirror circuit, the present HOST technique can be used in such a constant transconductance circuit. Instead of having N number of NFET devices in parallel on one side of the circuit, the embodiment of FIG. 5 illustrates a constant $g_m$ circuit 500 built using a single pair of NFET devices. In this instance, the M1 NFET coupled to $R_B$ is formed on the (100) substrate having the higher carrier mobility, while the M2 NFET device on the opposite side is formed on the (110) substrate having the lower carrier mobility. A similar circuit analysis reveals that the current $I_2$ is given by:

$$I_2 = \frac{1}{R_B^2}\left(1 - \frac{1}{\sqrt{\mu_{n1}/\mu_{n2}}}\right)^2 \left(\frac{2}{\mu_{n2}C_{ox}(W_2/L_2)}\right)$$

with the transconductance given by $$g_m = \frac{2}{R_B}\left(1 - \frac{1}{\sqrt{\mu_{n1}/\mu_{n2}}}\right)$$

wherein $\mu_{n1}$ and $\mu_{n2}$ are the mobility of the electrons on the (100) substrate and (110) substrate respectively. As should be appreciated, a PFET version of the constant transconductance circuit using the HOST technique could also be implemented.

Figure 6A:
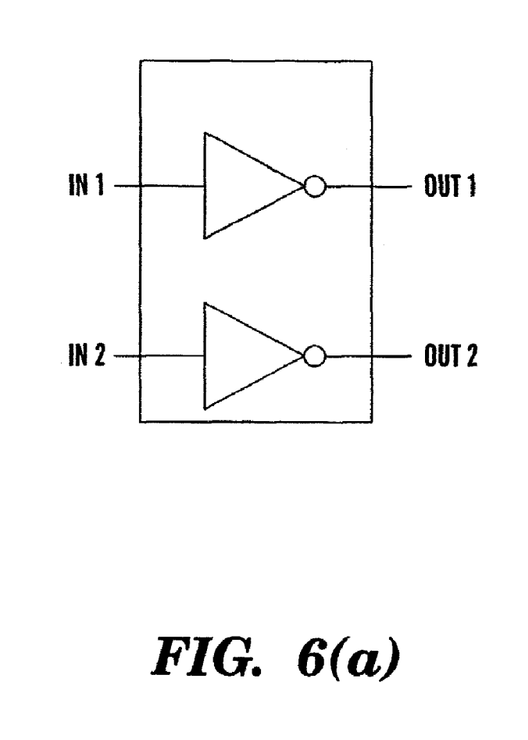
FIGS. 6(a) and 6(b) illustrate an inverter pair, representing an additional application for an embodiment of the invention, in which the NFET and PFET devices of a first inverter are formed on substrates that increase respective carrier mobilities and the NFET and PFET devices of a second inverter are formed on substrates that decrease respective carrier mobilities.
Figure 6B:
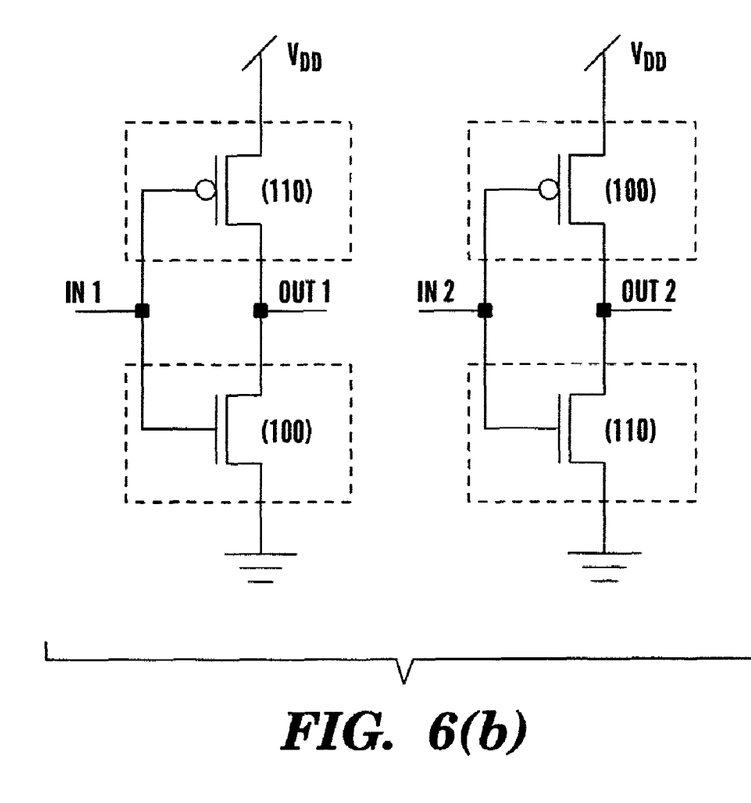

Still another practical application of a HOST device pair is in conjunction with applications where a precision fixed delay is desired. Since HOST pairs provide a fixed current offset when biased at the same voltage, and since the offset is defined by the mobility of the FET, the repeatability of this offset is excellent. For example, in a D flip-flop, inverter or a buffer, a signal delay therethrough is proportional to the biasing current; thus, a fixed signal delay can be generated when a HOST pair is used in such devices. FIG. 6(a) schematically represents an inverter pair, in which the upper inverter is intended to pass a signal quicker than the lower inverter, thereby generating a fixed delay with respect to Out 1 and Out 2. A HOST based realization of this inverter pair, in accordance with still a further embodiment of the invention, is shown in FIG. 6(b). As is shown, both the PFET device and NFET device of the first inverter are formed on respective substrates that enhance carrier mobility for quickest response time (i.e., the PFET on (110) silicon and the NFET on (100) silicon). In contrast, the PFET and NFET device of the second inverter are formed on respective substrates that reduce carrier mobility for a slower response time with respect to the first inverter (i.e., the PFET on (100) silicon and the NFET on (110) silicon).

Figure 7:
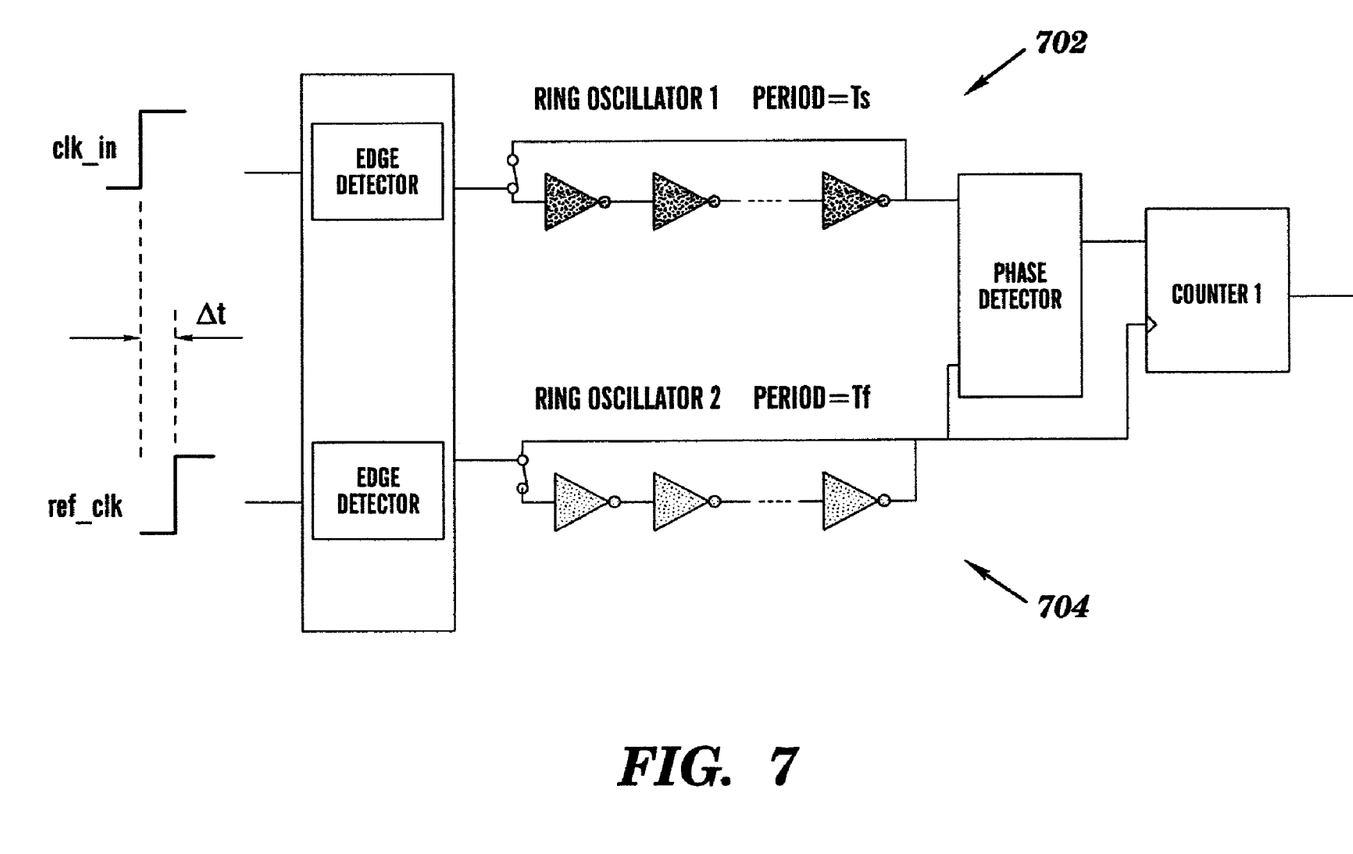
FIG. 7 is a schematic diagram of a pair of ring oscillator circuits, illustrating one possible use for inverter pair configured in accordance with FIG. 6(b).

Thus configured, an inverter pair according to the present hybrid substrate approach can further be used to create additional circuit functions, such as a pair of ring oscillators with a fixed frequency difference as shown in FIG. 7. The oscillators 702, 704, are formed through a chain of individual inverter elements. When used in a jitter test system for example, the ring oscillators are conventionally designed to provide two different frequencies by either biasing the inverters of each ring oscillator at different voltages or by using different device sizes. However, by using HOST devices to build the two ring oscillators 702, 704, the same biasing voltage can be used for each inverter along with FETs of like geometry. Again, the fixed offset is achieved by increasing the carrier mobility of an FET of a given conductivity and decreasing the carrier mobility of the same conductivity device in the other inverter. This architecture significantly improves the matching performance and, since the same biasing voltage is applied, the biasing circuit is much simpler to design.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A current mirror device for an integrated circuit, comprising:
   a reference current source;
   a first field effect transistor (FET) in series with the reference current source, the first FET of a first conductivity type formed on a first portion of a substrate having a first crystal lattice orientation; and
   a second FET of the first conductivity type formed on a second portion of the substrate having a second crystal lattice orientation, with a gate terminal of the first FET coupled to a gate terminal of the second FET, and the gate terminals of the first and second FETs coupled to the reference current source;
   wherein the carrier mobility of the first FET formed on the first portion of the substrate with the first crystal lattice orientation is different than the carrier mobility of the second FET formed on the second portion of the substrate having with the second crystal lattice orientation.

2. The current mirror device of claim 1, wherein the first conductivity is n-type, the first crystal lattice orientation comprises (110) silicon, and the second crystal lattice orientation comprises (100) silicon.

3. The current mirror device of claim 1, wherein the first conductivity is p-type, the first crystal lattice orientation comprises (100) silicon, and the second crystal lattice orientation comprises (110) silicon.

4. The current mirror device of claim 1, wherein the first and second FETs are configured with the same effective device geometry so as to have a non-unity output current gain dependent by the ratio of the carrier mobility of the second crystal lattice orientation to the first crystal lattice orientation.

* * * * *